United States Patent
Salfelner

(10) Patent No.: US 9,651,582 B2
(45) Date of Patent: May 16, 2017

(54) INTEGRATED CIRCUIT DEVICE FOR IMPEDANCE MEASUREMENT

(71) Applicant: NXP B.V., Eindhoven (NL)

(72) Inventor: Anton Salfelner, Gratkorn (AT)

(73) Assignee: NXP B.V., Eindhoven (NL)

( * ) Notice: Subject to any disclaimer, the term of this patent is extended or adjusted under 35 U.S.C. 154(b) by 200 days.

(21) Appl. No.: 14/645,222

(22) Filed: Mar. 11, 2015

(65) Prior Publication Data

US 2016/0266173 A1   Sep. 15, 2016

(51) Int. Cl.
*G01R 27/02* (2006.01)
*G01R 17/02* (2006.01)
*G01R 27/04* (2006.01)
*H03H 7/40* (2006.01)
*H04B 1/04* (2006.01)
*H04B 1/18* (2006.01)

(52) U.S. Cl.
CPC ............ *G01R 17/02* (2013.01); *G01R 27/04* (2013.01); *H03H 7/40* (2013.01); *H04B 1/0458* (2013.01); *H04B 1/18* (2013.01)

(58) Field of Classification Search
CPC .... H04B 17/12; H04B 17/21; H04B 17/0085; H04B 1/18; H04B 1/1027; H04B 1/0458; G01R 17/02; G01R 27/04; G01R 27/2605
See application file for complete search history.

(56) References Cited

U.S. PATENT DOCUMENTS

| 6,081,700 | A | 6/2000 | Salvi et al. |
|---|---|---|---|
| 6,326,929 | B1 * | 12/2001 | Berranger ............ G01R 29/10 343/703 |
| 6,862,432 | B1 | 3/2005 | Kim |
| 2008/0233869 | A1 | 9/2008 | Baker et al. |
| 2009/0231220 | A1 | 9/2009 | Zhang et al. |
| 2010/0144295 | A1 | 6/2010 | Kroeger et al. |
| 2010/0321086 | A1 | 12/2010 | See et al. |
| 2012/0214421 | A1 | 8/2012 | Hoirup et al. |
| 2013/0095775 | A1 | 4/2013 | Kim |
| 2013/0244589 | A1 | 9/2013 | Schmidhammer et al. |
| 2013/0342404 | A1 | 12/2013 | Anderson |
| 2014/0030988 | A1 | 1/2014 | Fu |
| 2014/0111226 | A1 * | 4/2014 | Lamesch ............ H03K 17/955 324/679 |
| 2014/0206296 | A1 | 7/2014 | Chakraborty et al. |
| 2015/0102869 | A1 | 4/2015 | Wang |
| 2015/0108961 | A1 | 4/2015 | Barlage et al. |
| 2015/0133064 | A1 | 5/2015 | Horne et al. |

OTHER PUBLICATIONS

Extended European Search Report for Patent Appln. No. 16159774.5 (Jul. 20, 2016).
European Search Report, 16159793.5, Mar. 8, 2016.

* cited by examiner

*Primary Examiner* — Minh N Tang
(74) *Attorney, Agent, or Firm* — Rajeev Madnawat

(57) ABSTRACT

A system for measuring impedance is disclosed. The system is designed to be connected with an external unknown impedance. The system includes a reference signal generator, an impedance component coupled to the reference signal generator, a local oscillator configured to generate a signal of a selected frequency, a plurality of frequency mixers coupled to the impedance component and the local oscillator and a switch connected across the impedance component in such a way that the impedance component is bypassed when the switch is on.

7 Claims, 5 Drawing Sheets

INTEGRATED CIRCUIT DEVICE FOR IMPEDANCE MEASUREMENT

RELATED APPLICATIONS

This application is related to application Ser. No. 14/645,177, entitled "Impedance Tuning Circuit" filed concurrent to this application and being incorporated herein by reference. This application is also related to application Ser. No. 14/645,198, entitled "Antenna Tuning Circuit" filed concurrent to this application and being incorporated herein by reference.

BACKGROUND

Antennas are used in wireless transmitters and receivers. During design and manufacturing phase, these antennas are tuned for optimal performance. However, the environmental changes and other external factors such as device's closeness to an interfering object may cause non optimal signal reception and transmission operation. In order to tune an antenna when a wireless device is in field use, it is necessary to measure impedance.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a system for measuring impedance is disclosed. The system is designed to be connected with an external unknown impedance. The system includes a reference signal generator, an impedance component coupled to the reference signal generator, a local oscillator configured to generate a signal of a selected frequency, a plurality of frequency mixers coupled to the impedance component and the local oscillator and a switch connected across the impedance component in such a way that the impedance component is bypassed when the switch is on. In some embodiments, the frequency of a signal generated by the reference signal generator is lower than the selected frequency.

The output of one of the plurality of mixers is used to determine amplitude/phase value of a signal when the switch is closed and the output of the one of the plurality of mixers is used to determine amplitude/phase value of the signal when the switch is open. The system is configured to calculate the impedance of the external unknown impedance based on the amplitude/phase values obtained when the switch is closed and when the switch is open.

The system may also include a controller coupled to the output of the one of the plurality of mixers and the controller may be coupled to a control bus. The control bus is adopted to be coupled to an external impedance matching network and the controller is configured to generate a control signal based on the calculated impedance and transmit the control signal on the control bus. The control signal is configured to cause a change in impedance in the external impedance matching network.

The system may also include a switch to couple the impedance component to an unknown impedance component internal to the system and disconnect the external unknown impedance. The impedance component is bypassed via a bypass path when the switch is on and the bypass path having a bypass path impedance greater than zero.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

DETAILED DESCRIPTION

So as not to obscure the disclosure, some well-known components are not being shown in figures and also not being discussed in herein. Those components, methods and usages are well within the common knowledge of a person skilled in the art.

Figure 1:
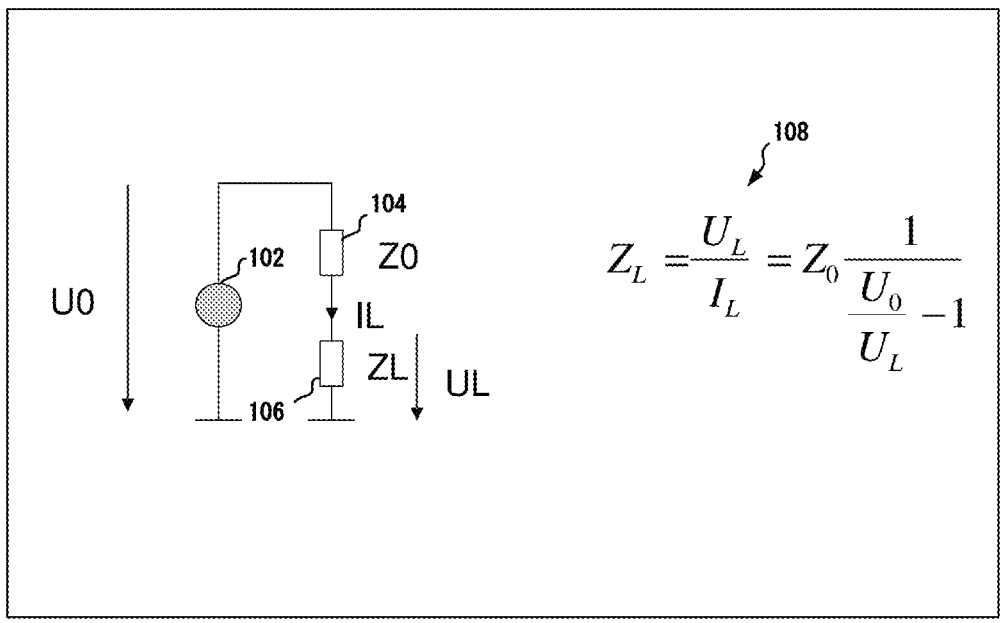
FIG. 1 is a depiction of an example circuit to demonstrate impedance measurement formula.

FIG. 1 illustrates an example circuit for demonstrating impedance calculations. The circuit includes a radio frequency (RF)/Voltage source 102, a known load 104 and an unknown load 106. The impedance of the load 104 is $Z_0$ and the impedance of the unknown load 106 is $Z_L$. $U_0$ and $U_L$ are voltages across $Z_0$-$Z_L$ and $Z_L$, respectively. $Z_L$ can then be calculated using the formula 108. This methodology will be used in the following description to determine unknown impedance of an antenna of a wireless device. Once the impedance of the antenna is known, the antenna can be tuned optimally by altering the impedance of an impedance matching network.

Figure 2:
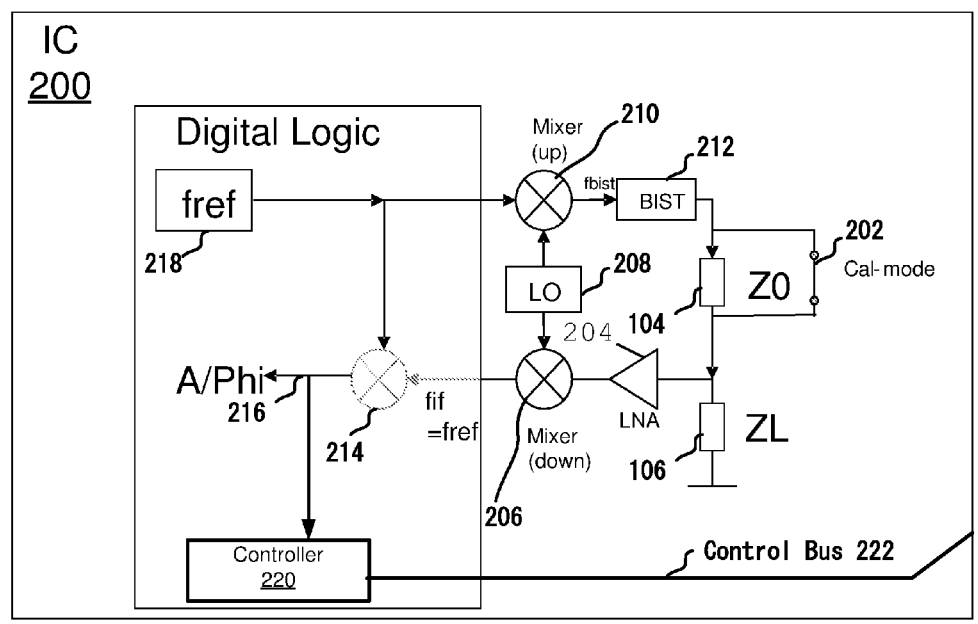
FIG. 2 illustrates schematic of a portion of an integrated circuit for a receiver or a transmitter in accordance to one of more embodiments of the present disclosure.

FIG. 2 shows a schematic diagram of portions of an integrated circuit (IC) 200 that includes analog and digital blocks. The IC 200 is designed to be interfaced with an antenna. The IC 200 includes impedance components 104 and 106 having impedances $Z_0$ and $Z_L$ respectively. The impedance component 104 can be bypassed by a calibration mode switch 202. The digital block of the IC 200 includes a reference frequency source ($f_{ref}$) 218. The reference frequency $f_{ref}$ is inputted to an up mixer 210. A frequency mixer is a nonlinear electrical circuit that creates new frequencies from two signals applied to it. A local oscillator (LO) 208 also provides an input to the up mixer 210. The differential output ($f_{bist}$) of the up mixer 210 is inputted to a test tone amplifier (BIST) 212. In one example, if $f_{ref}$ is 1 MHz and the LO output is 901 MHz, $f_{bist}$ would be 900 MHz. These frequencies may be selected based on the actual frequency band of a wireless device in which the IC 200 to be used.

The output of BIST 212 is coupled to the impedance component 104. The impedance component 104 is coupled to the impedance component 106. The impedance components 104 and 106 are coupled to a down mixer 206. A low noise amplifier 204 may be used in this coupling. The LO 208 also provides an input to the down mixer 206. The output of the down mixer 206 is coupled to a third mixer 214. The third mixer 214 may be inside the digital block of the IC 200. The reference frequency $f_{ref}$ 218 is also inputted to the third mixer 214. An amplitude/phase representation or complex amplitude 216 of the output of the third mixer 214 is obtained.

The IC 200 may include a controller 220 coupled to the output 216. The controller 220 may be configured or programmed to provide a control signal based on the output 216. The controller 220 is described in more details in the following paragraphs.

In one embodiment, the controller 220 is a digital circuit that produces a control signal based on the value of the measured Amplitude/Phase value and configured to transmit the control signal via a control bus 222. In one embodiment, the controller 220 may include an analog to digital converter to convert the measured Amplitude/Phase value to a digital word, e.g., the control signal. In other embodiments, the controller 220 may be a programmable component that can be operated through programming instructions. The control signal is defined to alter the impedance of an externally connected tunable matching circuit in correspondence with the measured Amplitude/Phase value.

Going back to FIG. 1 for a moment. In order to determine impedance $Z_L$, $U_O$ and $U_L$ must be known, assuming $Z_0$ is known. One reading with the switch 202 closed provides $U_O$ at the output 216. In some embodiments, $U_O$ may also be known, hence requiring no further measurements. Another measurement is taken with the switch 202 open to obtain $U_L$. When switch is closed, voltage $U_L$ across impedance component 106 will be same as $U_O$. As evident from the formula 108, $Z_L$ can be obtained when $Z_0$, $U_O$ and $U_L$ are known.

Figure 3:
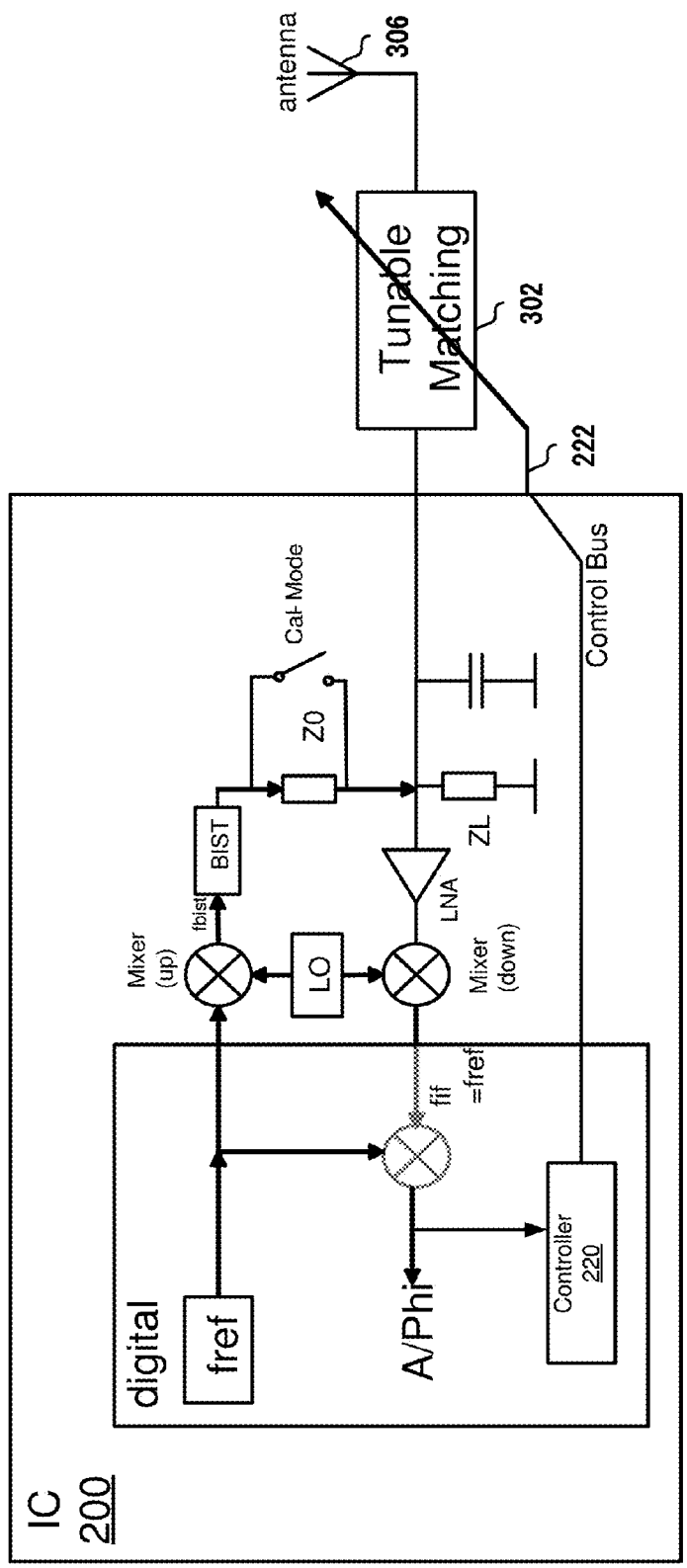
FIG. 3 illustrates a wireless system including an antenna in accordance to one of more embodiments of the present disclosure.

FIG. 3 illustrates a portion of a wireless system 300 including an antenna 306, a tunable matching circuit 302 and the IC 200 as described in FIG. 2. The control bus 222 is coupled to the tunable matching circuit 302. The tunable matching circuit 302 may include one or more tunable resistors (R), capacitors (C) and inductors (L). Varying one or more of these tunable components provide a varying impedance. By varying the impedance of the tunable matching circuit 302, the antenna 306 can be optimally tuned. In one embodiment, the tunable matching circuit 302 may include one or more R, L, C coupled together through switches operable by the control bus 222. Based on the control signal on the control bus 222, some switches may turn on or off thereby connecting or disconnected some R, L, C components and thereby altering the overall impedance. Other techniques such as the use of varicap, variable resistors, and variable inductors may be used instead or in conjunction to implement a variable impedance circuit. A varicap is a special type of diode that has a characteristic of decreasing its capacitance as the reverse voltage increases. In some examples, multiple varicap diodes may be used based on the need for a desired capacitance variation range.

It should be noted that the blocks shown in the figures herein and their couplings with other blocks or components are simplified so as not to obscure the disclosure. A person skilled in the art would readily appreciate that the systems and methods described here are merely non limiting examples. Further details of many well-known components is being omitted so as not to obscure the disclosure. It should also be noted that impedance matching is necessary for the best possible energy transfer from stage to stage. Typically, a matching network circuit is used between the antenna and the internal circuit to provide impedance matching between the internal circuit (e.g., a receiver or a transmitter) and the antenna. Since the impedance of an antenna is susceptible to environmental or external changes, ability to measure the impedance on the field use is important to enable a system to vary the impedance on the fly to optimize energy transfer between stages of the system.

As noted above, $U_O$, $U_L$ may be measured, with the switch 202 closed and open respectively and $Z_L$ may be calculated using the formula 108. Based on the output 216 or based on $Z_L$, the controller 220 may generate a control signal to drive, via the control bus 222, the RLC circuit of the tunable matching circuit 302. In one embodiment, the process of tuning the tunable matching circuit 302 may be performed at regular intervals. In another embodiment, the process of tuning the tunable matching circuit 302 runs as a continuous feedback loop. In yet another embodiment, the system 300 is configured to perform the process of tuning the tunable matching circuit 302 based on a user selection or setting.

Figure 4:
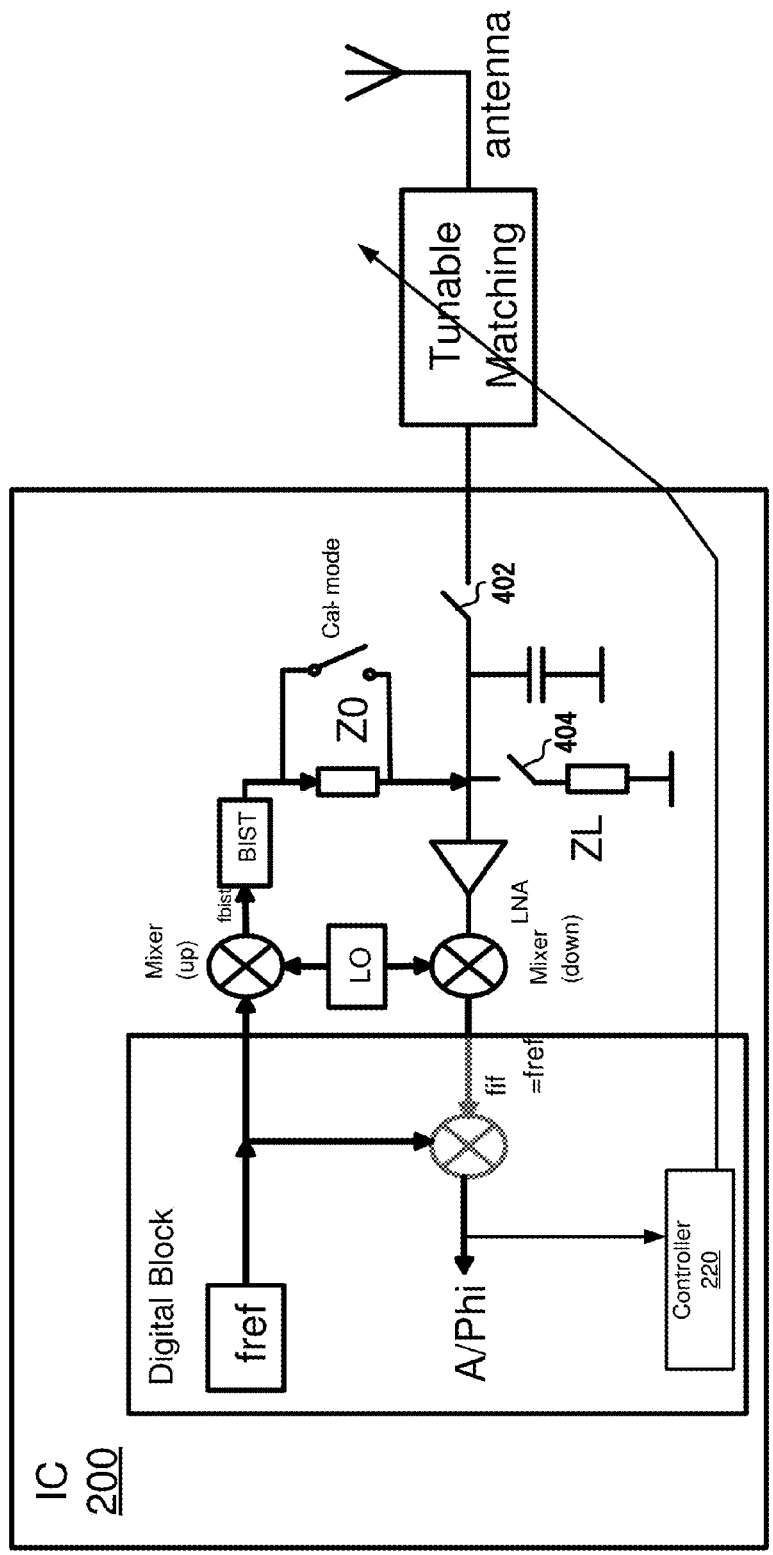
FIG. 4 illustrates a wireless system including an antenna in accordance in accordance with an embodiment of the present disclosure.

FIG. 4 illustrates another embodiment of the IC 200. As shown, a switch 404 is included to connect or disconnect impedance component 106 from the rest of the circuit. Similarly, a switch 402 is included to connect or disconnect external impedance from the internal circuit of the IC 200. When the switch 404 is closed and the switch 402 is open, $Z_L$ represents internal impedance. When the switch 404 is open and the switch 402 is closed, $Z_L$ represents external impedance and when both switches 402, 404 are closed, $Z_L$ represents a combination of internal and external impedance. The use of the switches 402, 404 allows using the same circuitry and controller to perform measurements on different loads, simply by switching switches 402, 404.

Figure 5:
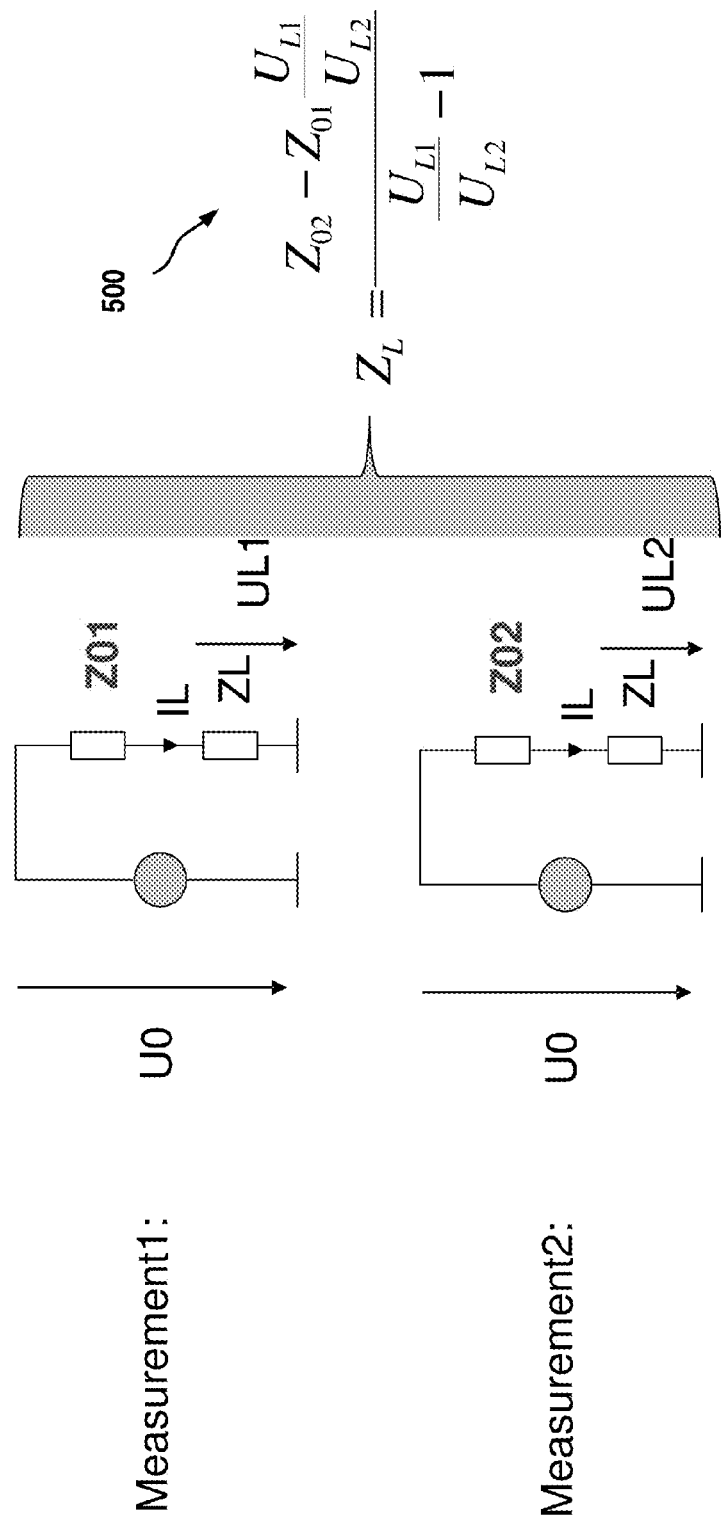
FIG. 5 illustrates a sample circuit for demonstrating impedance calculations in accordance with one embodiment of the present disclosure.

FIG. 5 illustrates another variant of the formula 108. Previously, it was assumed that when the switch 202 was closed, the bypass path introduced no impedance of its own. In some embodiments, practical consideration may require to use an impedance in the bypass circuit as for example to avoid propagating excessive power to a connected load. Given that $U_O$ is known, $U_{L1}$ and $U_{L2}$ may be measures, one with the switch 202 open and one with the switch 202 closed. Formula 500 may then be used to derive, based on the output 216, $Z_L$. Based on the derived $Z_L$, the controller 220 may generate a control signal to drive the tunable matching circuit 320.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. An integrated circuit (IC) for measuring impedance, the IC is designed to be connected with an external unknown impedance, the IC comprising:
    a digital block; and
    an analog block;
    the digital block comprising:
        a reference signal generator to generate a reference signal;
        a digital mixer having an input for receiving the reference signal; and
        a controller coupled to an output of the digital mixer;
    the analog block comprising:
        a local oscillator configured to generate a local oscillator signal of a selected frequency;
        an up mixer coupled to mix the reference signal from the digital block and the local oscillator signal and to output a first mixed signal;
        an impedance component coupled to receive a signal that corresponds to the first mixed signal, the impedance component having a known impedance;
        a switch connected across the impedance component in such a way that the impedance component is bypassed when the switch is on;
        a low noise amplifier to amplify the first mixed signal;
        a down mixer to mix the amplified signal with the local oscillator signal and to output a second mixed signal to the digital mixer within the digital block;
    wherein the controller of the digital block is coupled to a control bus that is connectable to an external tunable matching circuit;
    wherein the digital mixer is configured to mix the second mixed signal with the reference signal and wherein the output of the digital mixer is used by the controller to determine an amplitude/phase value of a signal when the switch is closed and to determine an amplitude/phase value of a signal when the switch is open, to calculate the impedance of the external unknown impedance based on the amplitude/phase values obtained when the switch is closed and when the switch is open, to generate a control signal based on the calculated impedance, and to transmit the control signal on the control bus, wherein the control signal is configured to cause a change in impedance in the external tunable matching circuit.

2. The IC of claim 1, wherein a frequency of the reference signal generated by the reference signal generator is lower than the selected frequency of the local oscillator signal.

3. The IC of claim 1, further including a first switch to couple the impedance component to an unknown impedance component internal to the IC and a second switch to disconnect the external unknown impedance from the IC.

4. The IC of claim 1, wherein the impedance component is bypassed via a bypass path when the switch is on and the bypass path having a bypass path impedance greater than zero.

5. The IC of claim 1, wherein the impedance component of the IC is separate from the external tunable matching circuit.

6. The IC of claim 5, wherein the impedance component is located in a signal path between the up mixer and the low noise amplifier.

7. The IC of claim 1, further including a switch to connect the impedance component to the external tunable matching circuit and to disconnect the impedance component from external tunable matching circuit.

* * * * *